United States Patent [19]
Ohsawa et al.

[11] Patent Number: 6,093,970
[45] Date of Patent: Jul. 25, 2000

[54] SEMICONDUCTOR DEVICE AND METHOD FOR MANUFACTURING THE SAME

[75] Inventors: Kenji Ohsawa; Makoto Ito; Yasushi Otsuka; Kazuhiro Sato, all of Kanagawa, Japan

[73] Assignee: Sony Corporation, Tokyo, Japan

[21] Appl. No.: 09/361,955

[22] Filed: Jul. 27, 1999

Related U.S. Application Data

[63] Continuation-in-part of application No. 08/812,358, Mar. 5, 1997, Pat. No. 5,945,741, which is a continuation-in-part of application No. 08/561,245, Nov. 21, 1995, abandoned, and a continuation-in-part of application No. 08/794,203, Dec. 1, 1998, Pat. No. 5,843,810.

[30] Foreign Application Priority Data

| Nov. 22, 1994 | [JP] | Japan | 6-314166 |
| Feb. 6, 1996 | [JP] | Japan | 8-019733 |
| Mar. 5, 1996 | [JP] | Japan | 8-047221 |
| Mar. 12, 1996 | [JP] | Japan | 8-054478 |

[51] Int. Cl.$^7$ .................................................. H01L 23/48
[52] U.S. Cl. .......................... 257/777; 257/668; 257/673; 257/700; 438/613; 438/737; 438/106
[58] Field of Search ................................ 438/106, 110, 438/111, 112, 118, 119, 121, 123, 125, 613, 737; 257/777, 668–673, 700, 701

[56] References Cited

U.S. PATENT DOCUMENTS

| 4,246,595 | 1/1981 | Noyori et al. | 357/70 |
| 4,356,374 | 10/1982 | Noyori et al. | 219/121 PE |
| 5,068,714 | 11/1991 | Seipler | 357/80 |
| 5,793,117 | 8/1998 | Shimada et al. | 257/780 |
| 5,986,338 | 11/1999 | Nakajima | 257/700 |

*Primary Examiner*—Matthew Smith
*Assistant Examiner*—Victor Yevsikov
*Attorney, Agent, or Firm*—Hill & Simpson

[57] ABSTRACT

An improved semiconductor device and method of manufacturing employs interconnecting films on film circuit as ground lines which extend to the periphery of the film circuit where there is a further connection to a conductive reinforcing plate 25. Advantageously, the conductive reinforcing plate reduces electrical noise from interfering with the semiconductor device and prevents the semiconductor device from radiating undesired signals. The interconnecting films also reduce cross-talk between signal lines of the semiconductor device.

10 Claims, 4 Drawing Sheets

SEMICONDUCTOR DEVICE AND METHOD FOR MANUFACTURING THE SAME

RELATED APPLICATION DATA

This application is a continuation-in-part of U.S. application Ser. No. 08/812,358 filed Mar. 5, 1997 now U.S. Pat. No. 5,945,741, which is a continuation-in-part of U.S. application Ser. No. 08/561,245 filed Nov. 21, 1995 now abandoned, and a continuation-in-part of U.S. application Ser. No. 08/794,203 which issued Dec. 1, 1998 as U.S. Pat. No. 5,843,810, each application and patent issuing thereon being incorporated herein by reference.

BACKGROUND OF THE INVENTION

1. Field of the Invention

The present invention relates generally to the field of semiconductor devices, and, more particularly, the present invention relates to an improved semiconductor package and method of manufacturing a package comprising an improved reinforcing plate and ground plane.

2. Description of the Related Art

There are known semiconductor devices with a structure wherein electrodes of a semiconductor element are bonded to edges of leads (interconnecting films) of a film circuit. A gap between the semiconductor element and the film circuit is filled up with sealing resin and a ring-shape reinforcing plate is adhered to the back surface of the film circuit for enclosing the semiconductor element.

FIGS. 5(A) and 5(B) are cross-sectional views of semiconductor devices manufactured in accordance with two different typical conventional technologies. First, the semiconductor device shown in FIG. 5(A) is explained. Notation a shown in the figure denotes a film circuit and notation b is a polyimide tape used as the base of the film circuit. Notation c denotes a interconnecting film serving as a lead and notation d is an insulating layer for selectively covering the surface of the film circuit a on the opposite side from the base b. The insulation film d is typically made of solder resist. Notation e is a solder ball formed on an opening f of the insulating layer d. Protruding on the surface of the lead c, the solder ball e is used as an external pin of the semiconductor device.

Notation g denotes a semiconductor element. Each electrode of the semiconductor element g is bonded to the edge of a portion of a lead c which protrudes to a device hole h. Notation i is sealing resin filling up a gap between the semiconductor element g and the film circuit a. Notation j is a reinforcing plate having the shape of a rectangular ring. The reinforcing plate j is adhered to the back surface of the film circuit a by adhesive agent k at a position enclosing the semiconductor element g.

Next, the semiconductor device shown in FIG. 5(B) is explained. Notation a' denotes a film circuit. Interconnecting films c each serving as a lead are formed on the back surface of a polyimide tape b which is used as the base of the film circuit a'. Through the polyimide tape b, openings f are bored to allow the leads c to protrude. On each of the openings f, a solder ball e serving as an external terminal is formed. Much like the semiconductor element g shown in FIG. 5(A), the semiconductor element g is connected to the lead c of the film circuit a'. A gap between the semiconductor element g and the film circuit a' is filled up with sealing resin i. A reinforcing plate j having the shape of a rectangular ring is adhered to the back surface of the film circuit a' by adhesive agent k.

The components composing the semiconductor device are assembled by using the following method. First of all, the semiconductor element g is attached to the film circuit a (a'). Then, the gap between the film circuit a (a') and the semiconductor element g is sealed with the resin i. Later on, the reinforcing plate j is adhered to the back surface of the film circuit a (a'). Then, the solder ball electrode e to be used as an external terminal is formed.

In the conventional technology shown in FIG. 5, the electrical connection between the film circuit a (a') and the reinforcing plate j does not exist, hence, resulting in the problem that it is difficult to prevent the introduction of noise from an external source and the structure itself generates electrical noise to the external world.

In addition, according to this conventional technology, after the semiconductor element g has been attached to the film circuit a (a'), the gap between them is sealed with the resin i and then the reinforcing plate j is adhered to the back surface of the film circuit a (a'). The adhesive agent k which juts out significantly resulting in a problem that, in some cases, the jutting out adhesive agent prevents the installation of the reinforcing plate j. In order to solve this problem, it is necessary to use a reinforcing plate j with an excessively large hole 1 bored thereon as shown in FIG. 5 (B). However, such a hole 1 is not desirable because the large hole 1 causes degradation in the effectiveness of the reinforcing plate j. That is to say, the semiconductor device shown in FIG. 5(B) inevitably causes the effectiveness of the reinforcing plate j to deteriorate.

In other related art approaches to chip manufacturing, the processes relied upon TAB bonding which requires a very thin resinous film and various treatments and processing of the film. This results in difficulty in the patterning of the lead limits the ability to achieve physically small leads or an increase in the number of leads. Additionally, accuracy is lower because the base used in such a process is easily bent. The present invention overcomes these disadvantages through the use of a stiff metal base.

Furthermore, in the related art processing of TAB devices, patterning by laser beam is required which is both expensive and time consuming. The problem of how to make a hole in the insulating film also is significant problem in such processes. The present invention overcomes these shortcomings by selective formation of the insulating film. Therefore patterning of the film to make holes is not required. Additionally, the surface for adhering an elastomer or a chip or a reinforcing plate had an unevenness or a level difference between the leads and the insulating film which results in difficulty in adhering and produces voids. Water disadvantageously can enter through such voids. The present invention also overcomes these shortcomings by providing a co-planar structure which has leads embedded in the insulating film. Additionally, previous related art processing required gold leads because a strong mask was required for etching. The present invention has a lead frame which is made from a metal layer having a good mechanical strength so that only copper is required.

The present invention is intended to solve the problems described above. It is thus an object of the Present invention to provide a semiconductor device that has an improved noise-reduction characteristic and allows a reinforcing plate to be attached to a film circuit without any difficulty. Other objects and advantages of the present invention will be apparent from the following summary and detailed description of the preferred embodiments when viewed in light of the drawings.

SUMMARY OF THE INVENTION

A semiconductor device according to the present invention is characterized in that a interconnecting film used as a ground line is formed at the periphery of a film circuit and a conductive reinforcing plate is electrically connected with the ground line at the periphery of the film circuit. In this way, according to the semiconductor device provided by the present invention, the reinforcing plate enclosing a semiconductor element can be used as a ground line and, in turn, serves as an electrostatic shield against other components.

A method for manufacturing a semiconductor device provided by the present invention is characterized in that the method comprises the steps of: making a reinforcing plate adhere to a film circuit; positioning a semiconductor element at a location enclosed by the reinforcing plate; bonding electrodes of the semiconductor element to semiconductor-element side terminals of the film circuit; and sealing a space between the reinforcing plate, the film circuit and the semiconductor element.

As described above, according to the method for manufacturing a semiconductor device provided by the present invention, after a reinforcing plate is adhered to a film circuit, a semiconductor element is attached to the film circuit prior to sealing. Thus, there is no concern that the sealing agent for filling up the gap between the semiconductor element and the film circuit prevents the adhesion of the reinforcing plate to the film circuit. As a result, the reinforcing plate can be adhered to the film circuit without any hindrance. That is to say, it is not necessary to use a reinforcing plate with an excessively large hole as is the case with the semiconductor device shown in FIG. 5 (B) which is designed with the installability of the reinforcing plate taken into consideration. Accordingly, the purpose of the reinforcing plate is also not degraded.

These and other features of the invention are discussed in greater detail below in the following detailed description of the presently preferred embodiments with reference to the accompanying drawings.

DETAILED DESCRIPTION OF THE PRESENTLY PREFERRED EMBODIMENTS

Figure 1A:
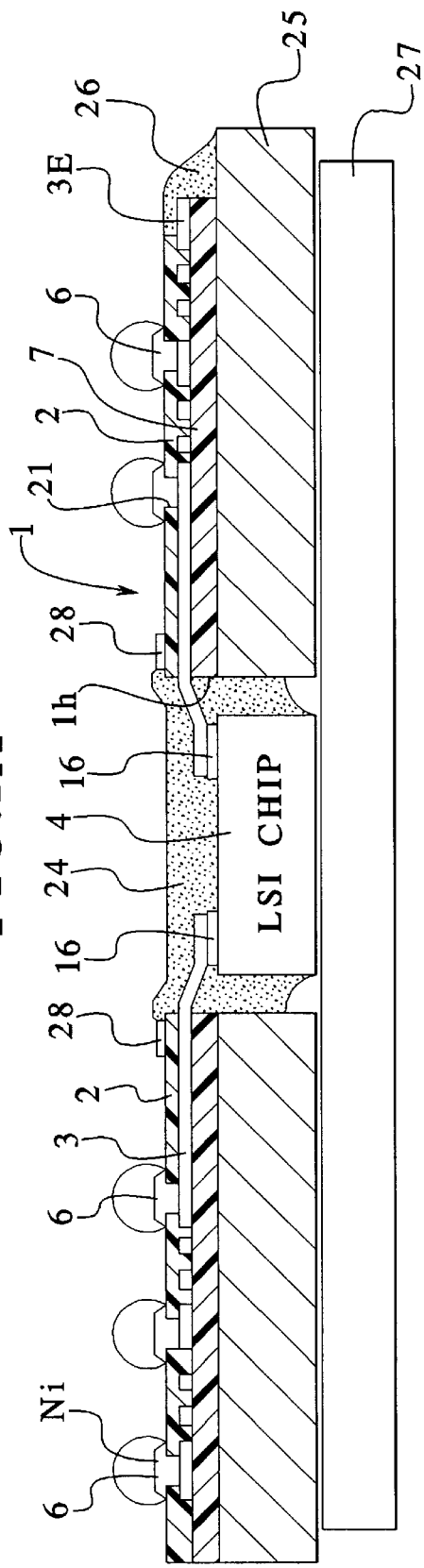
FIGS. 1(A) and (B) are diagrams showing a semiconductor device provided by a first embodiment of the present invention with FIG. 1(A) showing a cross-sectional view of the semiconductor device and FIG. 1(B) being a plan view of a portion thereof.
Figure 1B:
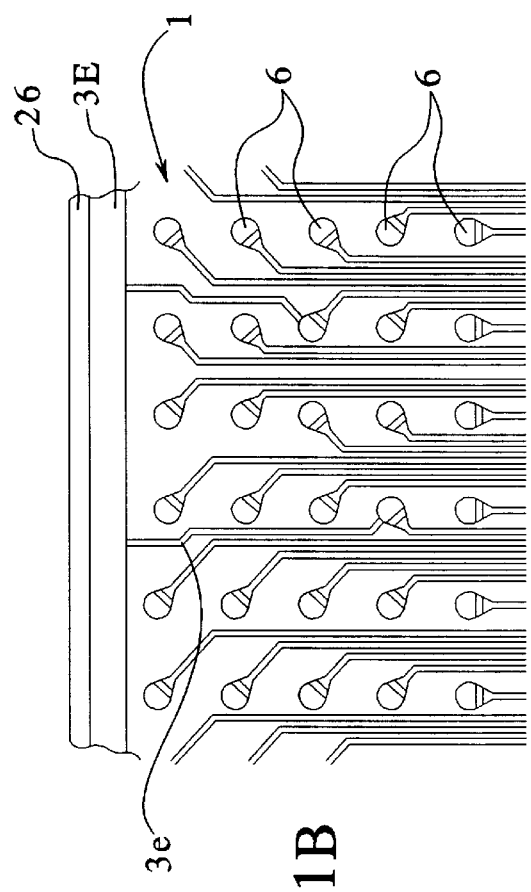

The present invention will become more apparent from the following detailed description of some preferred embodiments with reference to accompanying diagrams showing the embodiments. FIGS. 1(A) and (B) are diagrams showing a semiconductor device provided by a first embodiment of the present invention. FIG. 1(A) is a diagram showing a cross section of the semiconductor device and FIG. 1(B) is a plan view showing a portion thereof.

Reference numeral 1 shown in the figures is a film circuit on which a plurality of interconnecting films 3 are formed to serve as leads on the back surface of an insulating layer 2. Reference numeral 3E is a interconnecting film 3 which is formed along the periphery of the film circuit 1 to serve as a ground line. Reference numeral 3e is a interconnecting film serving as a lead connected to the ground line 3E. The inner end of each lead 3 protrudes through a device hole 1H on the insulating layer 2. The protruding inner end serves as a connection terminal connected to an electrode of a semiconductor element 4. Reference numeral 6 is a ball electrode which is formed by plating an opening 21 for exposing a lead 3 formed on the insulating layer 2. The ball electrode 6 has a double-layer structure comprising a nickel layer and a solder or gold layer.

Reference numeral 25 is a reinforcing plate having a rectangular-ring shape and may be made of aluminum. The reinforcing plate 25 is adhered to the back surface of the film circuit by elastic adhesive agent 7. At least, a portion of the reinforcing plate 25 juts out from the film circuit 1. Reference numeral 4 is a semiconductor element. Electrodes of the semiconductor element 4 are each bonded to a bump 16 at the end of a lead 3. Reference numeral 24 is sealing resin for filling up a gap between the semiconductor element 4, the film circuit 1 and the reinforcing plate 25. Reference numeral 26 is a paste film for connecting the ground line 3E and the reinforcing plate 25 to each other at the periphery of the film circuit 1. Reference numeral 27 is a heat sink made to adhere to the bottoms of the semiconductor element 4 and the reinforcing plate 25. The heat sink 27 may be made of aluminum.

In such a semiconductor device, the reinforcing plate 25 enclosing the semiconductor device 4 can be used as a ground line and, in turn, serves as an electrostatic shield against other components. As a result, it is possible to prevent introduction of noise to the semiconductor element 4 from a source external to the semiconductor device and prevent noise generated inside the semiconductor element 4 from being radiated to the external world. Additionally, the lead 3e connected to the reinforcing plate 3E can prevent the generation of crosstalk in the semiconductor element.

In particular, in the case of a semiconductor device in which a number of buffers are turned on and off by a pulse signal having a high frequency with the same timing as is the case with a synchronous DRAM, the problem caused by switching noise can not be ignored. However, the effect can be significantly reduced by the structure of the semiconductor device in which the leads 3e are provided periodically, for example, between each pair of input and output sides and a ground line 3E connected to a lead 3e is linked to the reinforcing plate 25 by the conductive paste film 26.

FIGS. 2(A) to (I) are cross-sectional views showing the process steps for making a film circuit and making a reinforcing plate adhere to the back surface of the film circuit in accordance with the present invention..

Figure 2A:
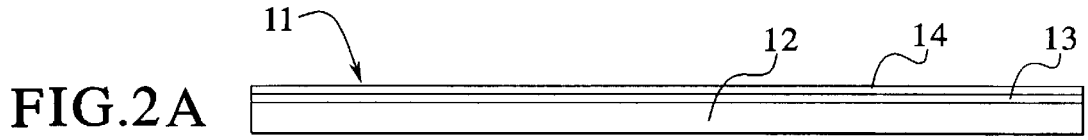
FIGS. 2(A) to (I) are cross-sectional views showing an order of processes for creating a film circuit and adhering a reinforcing plate of the semiconductor device shown in FIG. 1.

(A) First of all, a metal stacking plate 11 having a three-layer structure is prepared as shown in FIG. 2(A). The stacking plate 11 is formed by stacking a copper layer 12 with a typical thickness of 150 microns, an aluminum layer 13 with a typical thickness of 3 microns playing the role of an etching stopper and a coated underlayer 14 made of copper or nickel with a typical thickness of 2 microns. It should be noted that the coated underlayer 14 can be formed into a multi-layer structure by typically forming a nickel layer with a typical thickness of 2 microns on a chrome layer having a typical thickness of 0.2 microns.

Figure 2B:
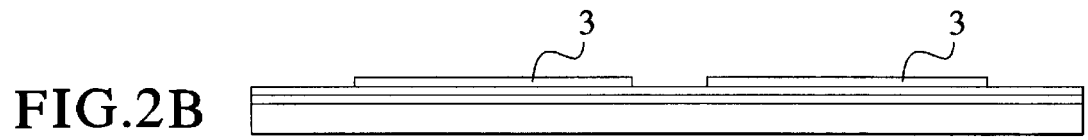

(B) Next, leads 3, . . . , 3 are formed on the coated underlayer 14 as shown in FIG. 2(B). Specifically, the surface of the underlayer 14 is coated with resist of a negative pattern for creating a pattern of the leads 3, . . . , 3. The surface of the underlayer 14 is then covered with a coating layer made of copper or nickel having a typical thickness of 30 microns with the resist used as a mask. In such a process, there is no side etching. As a result, fine leads 3, . . . , 3 can be formed with a high degree of precision. It is preferred that an edge of the lead 3 extend from the insulating film 2 at the terminal side of the semiconductor device because cutting or trimming of the leads is therefore unnecessary as in the prior art for bonding. This reduces the bonding time.

Rather than forming the leads and ground line on the coated underlayer, those skilled in the art will recognize that the leads and ground line can be formed from the coated underlayer by etching in a desired pattern.

Figure 2C:

(C) Then, etching is selectively carried out to penetrate the metal stacking plate 11 from both the surfaces of the metal stacking plate 11 as shown in FIG. 2(C). In this way, a number of film circuits are formed into a lead-frame structure integrating the film circuits. Typically, the etching process is carried out by using etching liquid of the second iron-chloride group. Reference numeral 30 is an external hole bored by the etching process.

(D) Next, insulating layers (insulation films) 2 are selectively formed on the surface of the stacking plate 11 on which the leads 3 were formed. The insulating layers 2 are made of a photosensitive resin material. The resin is used as a coating material applied to the surface of the stacking plate 11. The coating material then undergoes exposure and development processes to be converted into a desired pattern. Reference numerals 21, . . . , 21 each denote an opening for exposing a portion for creating a ball electrode 6 of the lead 3 of each insulating layer 2. The insulating layers 2 are selectively formed in such a way that the openings 21 result. As a result, it is not necessary to carry out patterning by, for example, a laser process to create the insulating layers 2 later on.

Figure 2D:
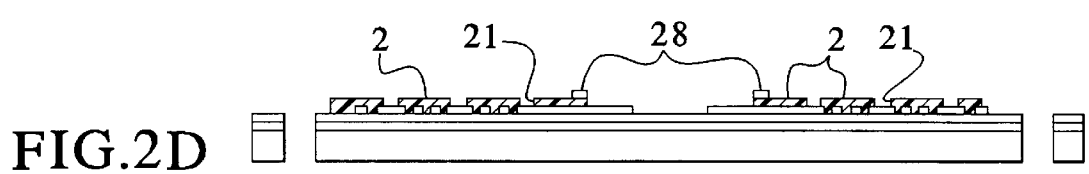

Later on, a ring-shaped dam 28 made of a resin film is formed. Specifically, the ring-shaped dam 28 plays the role of preventing sealing resin 24 from leaking at the time the resin 24 is used for sealing after the electrodes of the semiconductor element 4 have been bonded to the inner edges of the leads 3, . . . , 3. It should be noted, however, that the ring-shaped dam 28 is not necessarily indispensable. FIG. 2(D) is a diagram showing a state that results after the ring-shaped dam 28 has been formed.

A photosensitive material may be used as the insulating film (2) and the patterned layer may be produced by exposing and developing after smearing the material. 21 . . . 21 are openings which expose parts where ball electrodes can be made. The insulating film (2) is therefore formed selectively in order to provide the openings 21 . . . 21. Accordingly it is not necessary to pattern the insulating film with a laser as in the prior art which is a time-consuming process.

Figure 2E:
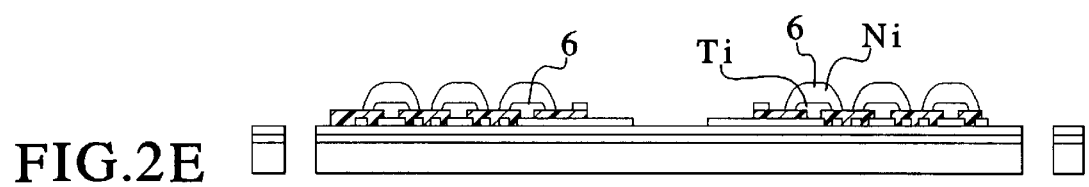

(E) Then, solder balls 6, . . . , 6 each to serve as an external terminal are formed on the surfaces of the leads 3, . . . , 3 with the insulating layers 2 used as a mask as shown in FIG. 2(E). The solder balls 6, . . . , 6 each comprise a nickel coating layer with a typical thickness in the range 80 to 110 microns and a solder or gold coating layer with a typical thickness in the range 10 to 30 microns.

Figure 2F:
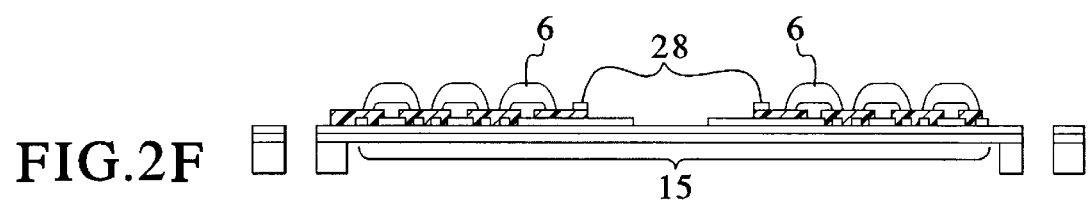

(F) Then, as shown in FIG. 2(F), portions of the thick copper layer 12 provided on the rear-surface side of the stacking plate 11 are selectively removed by etching from the rear-surface side. The removed portions correspond to a main portion 15 of a film circuit 1. The etching is carried out by using etching liquid of, typically, the $H_2SO_4/H_2O_2$ group. This is because the etching liquid invades copper but does not invade aluminum so that the aluminum layer 13 can play the role of an etching stopper.

$H_2SO_4/H_2O_2$ is used in liquid form because this etchant etches copper but not aluminum so that the aluminum (13) can be used as the etching stopper.

Figure 2G:
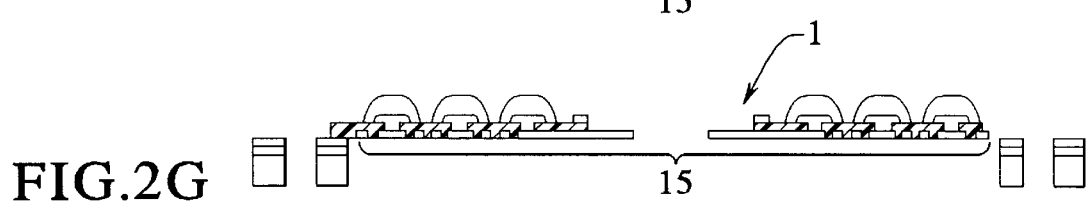

(G) Next, as shown in FIG. 2(G), the coated underlayer 14 and the aluminum layer 13 serving as an etching stopper are etched out with the leads 3, . . . , 3 used as a mask. This etching makes the leads 3, . . . , 3 independent of each other, ending an electrically shorted state for the first time.

Figure 2H:
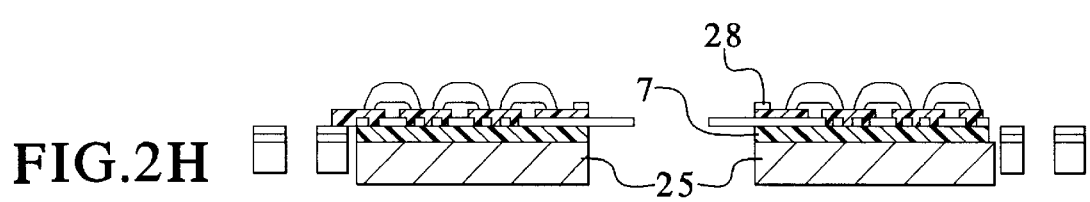
Figure 2I:
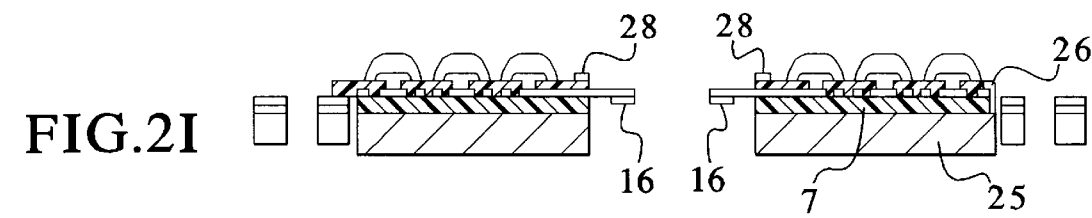

(H) Then, as shown in FIG. 2(H), a rectangular ring-shaped reinforcing plate 25 is adhered to the back surface of the main portion of the film circuit 1 by using adhesive agent 7 capable of serving as a cushion.

(I) Next, as shown in FIG. 1(I), bumps 16, . . . , 16 are formed on the edges of the leads 3, . . . 3. It should be noted that, alternatively, the bumps 16, . . . 16 are formed on the side of the semiconductor element 4 or they may not be formed at all.

As described above, in this embodiment, the leads 3, . . . 3 are formed by growing a coating film on the coated underlayer with selectively formed resist films used as a mask. It should be noted, however, that the leads 3, . . . 3 can be formed by first forming the layer 14 made of copper or nickel with an excessively large thickness and then carrying out a patterning process through selective etching of the copper or nickel layer 14.

Next, the order of process steps for attaching a semiconductor element and a heat sink to the film circuit supported by the reinforcing plate are explained with reference to FIGS. 3(A) to 3(E).

Figure 3A:
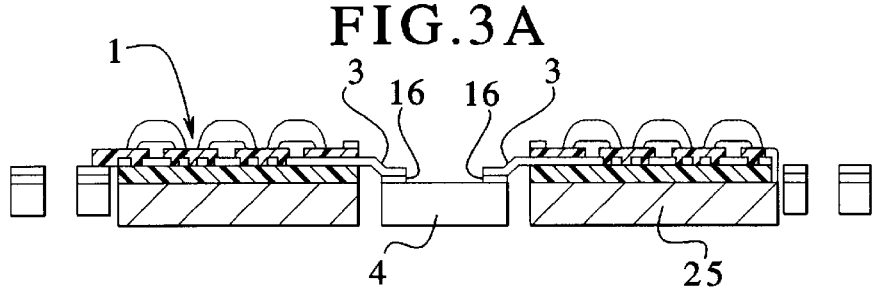
FIGS. 3(A) to 3(E) are cross-sectional views showing processes for completely manufacturing the semiconductor device shown in FIG. 1 including a process for attaching a semiconductor element to a film circuit supported by a reinforcing plate.

(A) First of all, as shown in FIG. 3(A), the bumps 16, . . . 16 on the edges 3a, . . . 3a of the leads 3, . . . 3 are connected to electrode pads 5, . . . 5 of the semiconductor element 4 by using, typically, the single-point bonding technique.

Figure 3B:
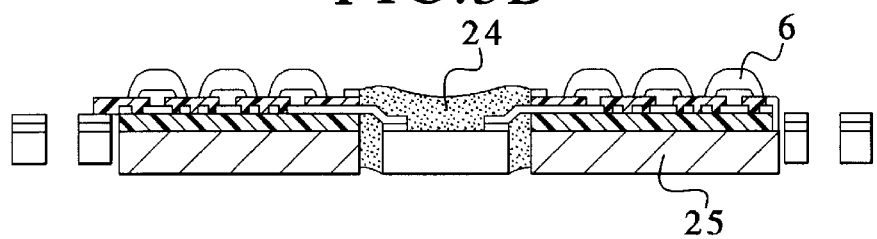

(B) Then, as shown in FIG. 3(B), the gap between the semiconductor element 4, the film circuit 1 and the reinforcing plate 25 is sealed by potting using liquid resin 24. At that time, it is possible to prevent the liquid resin 24 from leaking from the sealed portion to its surroundings by means of the dam 28.

Figure 3C:
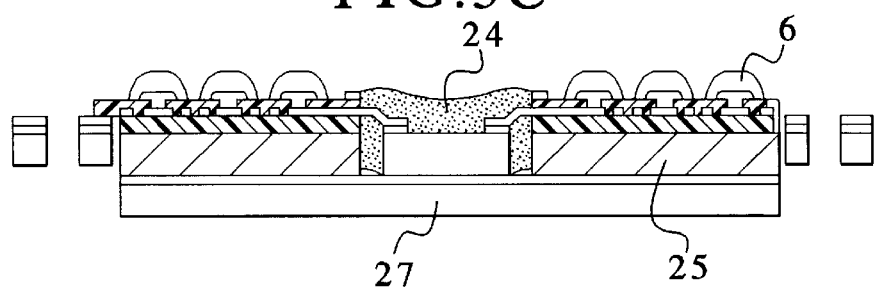

(C) Next, as shown in FIG. 3(C), a heat sink 27 is adhered to the back surfaces of the semiconductor element 4 and reinforcing plate 25.

Figure 3D:
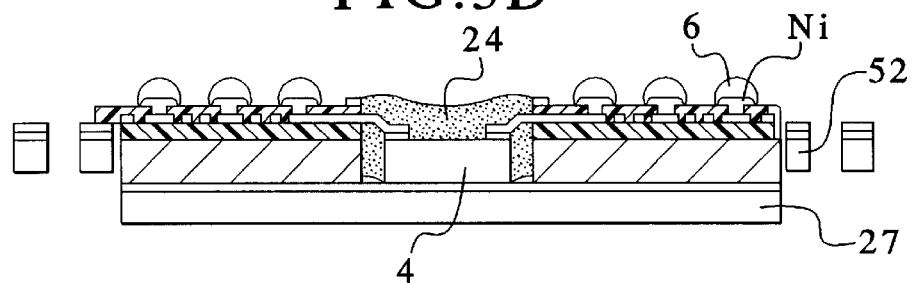

(D) Then, the shape of each of the solder electrodes 6, . . . 6 each serving as an external terminal is reshaped into a dome shape by reflow fusing as shown in FIG. 3(D).

Figure 3E:
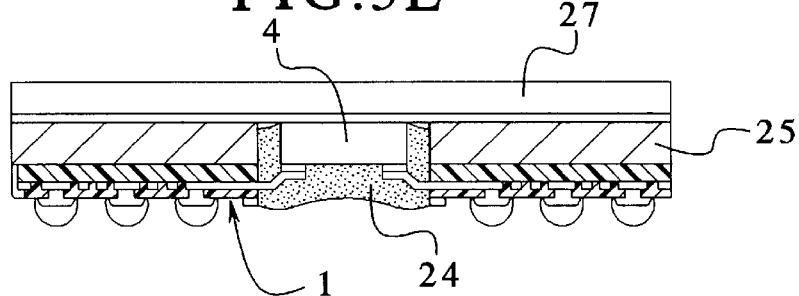

Later on, conductive paste for electrically connecting the ground line 3E to the reinforcing plate 25 is used as a coating material. Unnecessary portions of the metal stacking plate 11 having a lead-frame shape are cut out and removed away in order to make the film circuits 1 independent of each other. The semiconductor device is finally turned upside down to give a semiconductor device provided by the present invention as shown in FIG. 3(E).

The embodiment described above offers the following advantages.

In the first place, the embodiment offers an advantage that the reinforcing plate 25 can be adhered to the back surface of the film circuit 1 with no unevenness.

That is to say, in the present embodiment, the lead 3 is formed on one side of the etching-stop layer 14 of the film circuit 1. Later on, the insulating layer 2 is formed. Then, since the underlayers used in the process of creating the lead 3 and the insulating layer 2 (that is, the etching-stop layer 13 and the coated underlayer 14) are removed, the surfaces of the lead 3 and the insulating layer 2 are surfaces with no unevenness or flat surfaces which are located at the same level. These surfaces become the surface of the semiconductor element 4.

Accordingly, the rectangular ring-shaped reinforcing plate 25 can be adhered to the unevenness-free back surface of the main portion of the film circuit 1 by using the adhesive agent 7 which is capable of serving as a cushion. As a result, it is possible to solve the problem of an insufficient adhering force caused by voids generated in the adhesive agent as is the case with the conventional semiconductor device wherein the reinforcing plate is adhered to an uneven surface.

In the second place, in the present embodiment, the electrode 6 can be formed by using coating technology. On the top of that, the copper layer 14 is formed completely as a coated underlayer. As a result, a potential required for coating can be provided to the lead 3 through the copper layer 13, giving rise to an advantage that it is not necessary to create an interconnecting film but it is only required to provide the potential.

That is to say, in the case of the conventional technology, since the interconnecting film formed on a polyimide tape is used as a film circuit, it is difficult to apply a coating technology to create an electrode on a lead. For this reason, a solder ball electrode is formed by using a relatively simple technology such as one whereby melting solder is merely dropped on an external-electrode creation portion. However, a solder ball electrode made by using such a technology has a problem in that it breaks easily. In particular, there is a concern that the solder electrode 6 will break due to thermal stress resulting from a difference in coefficient of thermal expansion between the reinforcing plate 25 and the film circuit 1.

On the other hand, another technology can be used to create an extremely-high-quality solder ball electrode that is not prone to the problem of breaking or the like. According to this technology, first of all, a coating layer typically made of nickel is formed on the surface exposed to the opening of a lead and either solder is then formed thereon or the coating layer is further coated with gold.

In the case of this technology, however, it is necessary to provide a potential to each lead on which the solder is to be formed. This is because electrical coating is otherwise impossible. Since each lead is electrically independent from the beginning, however, it becomes necessary to create a interconnecting film only for providing a potential to each lead in order to carry out electrical coating. It is a matter of course that such an interconnecting film, if formed for coating purposes only, gives rise to a problem that the integration scale of the film circuits is thereby limited.

In the case of the present embodiment, in contrast, the metal stacking plate 11 having a three-layer structure is used. The thinner copper layer 4 is used as a coated underlayer for creating the leads 3, . . . 3. At the time the electrodes 6, . . . 6 are formed, a coating potential can be provided to each of the leads 3, . . . 3 through the coated underlayer 4. As a result, even without creating a interconnecting film for coating purposes only, good electrodes 6, . . . 6 can be formed by coating.

In addition, a variety of processes such as the creation of the leads 3, . . . 3 can be carried out with the metal stacking plate 11 used as a base. Unlike a resin film, the metal stacking plate 11 which is used as a base exhibits strong rigidity, making it possible to create fine leads with a high degree of precision and a high degree of positioning accuracy.

That is to say, the conventional technology has a problem that, because a film circuit undergoes a variety of processes and fabrications with a thin resin film used as a base, good processes and fabrications are difficult to carry out. In particular, good patterning is very difficult to carry out on a lead b, limiting the processes available to make the lead fine and to produce a multi-pin lead. In addition, the positional accuracy of the patterning is also prone to deterioration caused by deformation such as through bending of the base.

According to the present invention, on the contrary, a film circuit 1 and others are formed by carrying out fabrication and a variety of processes on the metal stacking plate 11 which has strong rigidity and which is used as a base. As a result, problems such as the one caused by the bending of the base does not arise.

Figure 5A:
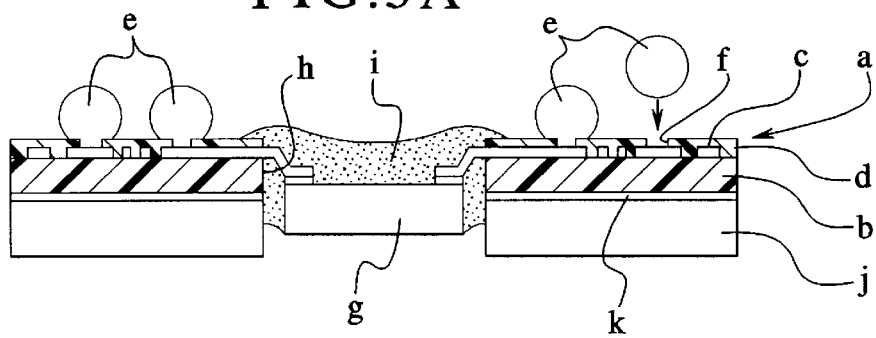
FIGS. 5(A) and 5(B) are cross sectional views of semiconductor devices manufactured in accordance with two different typical prior arts.
Figure 5B:
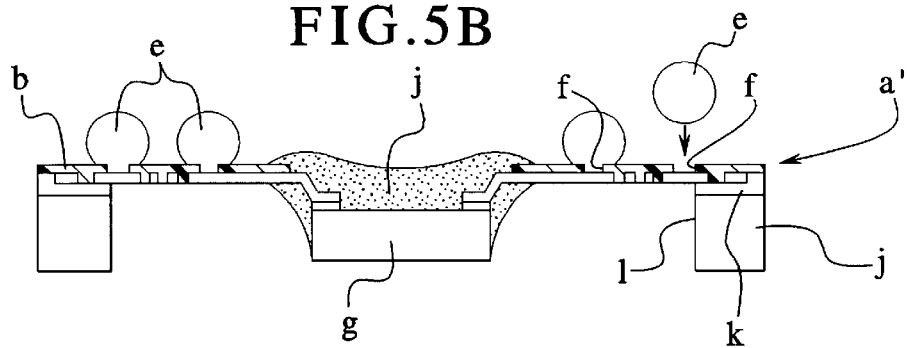

In addition, in this embodiment, a reinforcing plate 25 is adhered to the back surface of the film circuit 1 and, then, a semiconductor element 4 is placed at a location enclosed by the reinforcing plate 25. Subsequently, electrodes of the semiconductor element 4 are bonded to the terminals of the leads 3, . . . 3 of the film circuit 1 on the semiconductor-element side. Later on, a space between reinforcing plate 25, the film circuit 1 and the semiconductor element 4 is filled up with sealing resin 24 so that there is no longer a concern that the sealing resin 24 filling up the gap between the semiconductor element 4 and the film circuit 1 prevents the adherence of the reinforcing plate 25 to the film circuit 1. As a result, the reinforcing plate 25 can be installed without any difficulty, making it unnecessary to use a reinforcing plate with an excessively large hole as is the case with the semiconductor device shown in FIG. 5 (B) which is designed with the installability of the reinforcing plate taken into consideration. Accordingly, the reinforcement effect of the reinforcing plate is also not degraded.

Figure 4:
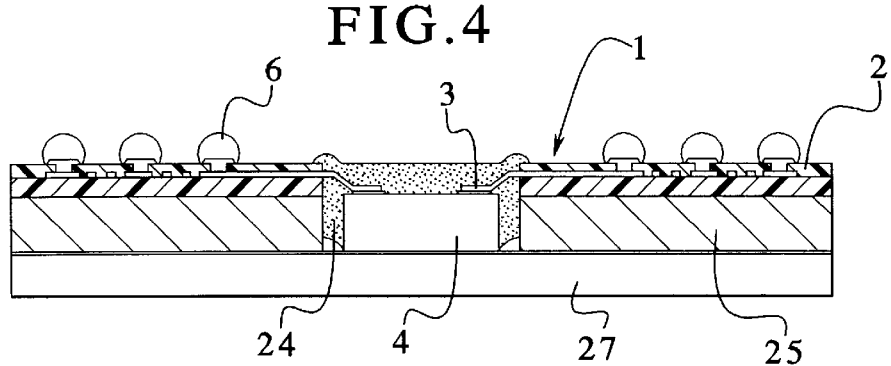
FIG. 4 is a cross-sectional view of a semiconductor device that can be manufactured by using a semiconductor device manufacturing method provided by the present invention.

It is a matter of course that heat generated by the semiconductor element 4 can be effectively dissipated by the heat sink 27. It should also be noted that a semiconductor device having no ground line like the one shown in FIG. 4 can also adopt the technological concept provided by the present invention wherein, after a reinforcing plate has been formed on the back surface of a film circuit, a semiconductor element is connected to the film circuit before sealing.

As is obvious from the above description, according to the semiconductor device provided by the present invention, the reinforcing plate enclosing the semiconductor element can be used as a ground plane and, in its turn, serves as an electrostatic shield against other components.

Figure 6:
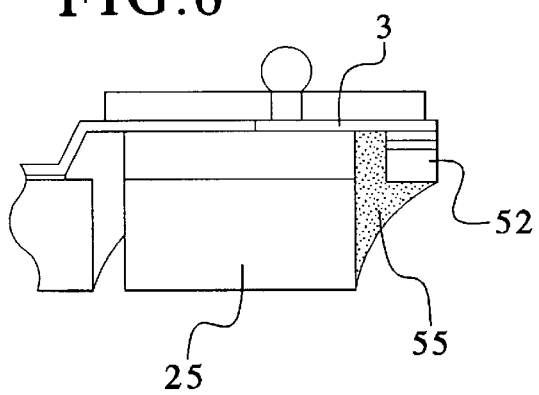
FIG. 6 illustrates a further alternate embodiment of the present invention wherein an external reinforcing ring extends around a periphery of the package.

FIG. 6 illustrates a further alternate embodiment of the present invention wherein an external reinforcing ring 52 is further connected to the conductive reinforcing plate 25 via a conductive paste 55. In the illustrated embodiment at least one lead 3 extends over and is connected to a top portion of the three layer stacking plate which advantageously forms the external reinforcing ring 52. It should be recognized that the connection between the lead 3 and the external reinforcing plate 52 is unnecessary and that the electrical connection between the external reinforcing ring may be exclusively made with the conductive paste 55. In such an embodiment the lead 3 does not extend to and connect with the external reinforcing ring 52. The external reinforcing ring is specifically described in greater detail in application Ser. No. 08/794,203 filed Jan. 31, 1997, issued Dec. 1, 1998, as U.S. Pat. No. 5,843,810, entitled "FILM CIRCUIT AND METHOD OF MANUFACTURING THE SAME", which is incorporated herein by reference. However, it should be noted that the processing can be achieved by forming the device as set forth in FIG. 3 of the instant application but that in stage D of the manufacturing process, a conductive paste may be applied between the conductive reinforcing plate 25 and the external reinforcing ring 52 which is a portion of the stacking plate. As noted previously, the lead 3 may or may not extend over the external reinforcing ring 52.

According to a method for manufacturing a semiconductor device provided by the present invention, after a reinforcing plate is adhered to a film circuit, a semiconductor element is attached to the film circuit prior to sealing. Thus, there is no concern that the sealing agent for filling up the gap between the semiconductor element and the film circuit will prevent the adhesion of the reinforcing plate to the film circuit. As a result, the reinforcing plate can be adhered to the film circuit without any hindrance. That is to say, it is not necessary to use a reinforcing plate with an excessively large hole as is the case with a semiconductor device designed with the installability of the reinforcing plate taken into consideration. Accordingly, the enforcement effect of the reinforcing plate is also not inevitably degraded.

Figure 7:
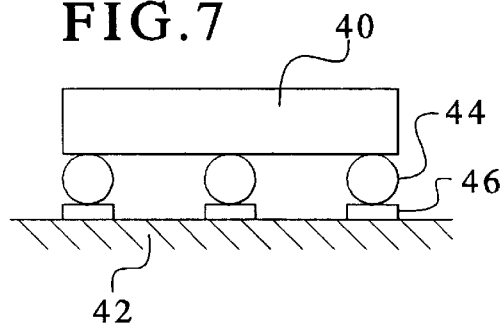
FIG. 7 illustrates an assembly in which a semiconductor device of the present invention is joined to a mother board.

FIG. 7 illustrates an assembly in which a semiconductor device of the present invention is joined to a mother board. As illustrated, a semiconductor device 40 made in accordance with the principles disclosed above, is suitably joined to a mother board or circuit board 42 by way of respective registering external electrodes 44 and 46. The electrodes 44, of course, are ball electrodes as described above. The semiconductor device 40 can be secured to the board 42 by any associated means such as clips, soldering, adhesion, etc.

Although modifications and changes may be suggested by those skilled in the art, it is the intention of the inventors to embody within the patent warranted hereon all changes and modifications as reasonably and properly come within the scope of their contribution to the art.

What is claimed is:

1. A method for manufacturing a semiconductor device, the method comprising the steps of:
adhering an electrically conductive reinforcing plate to a film circuit;
placing a semiconductor element at a location surrounded by said reinforcing plate;
bonding electrodes of said semiconductor element to a terminal of said film circuit on a semiconductor-element side; and
sealing a space between said reinforcing plate, said film circuit, and said semiconductor element.

2. A method for manufacturing a semiconductor device according to claim 1, further comprising a step of electrically connecting the reinforcing plate with a ground line formed in a periphery of said film circuit.

3. A method of manufacturing a semiconductor device comprising the steps of:
forming a plurality of leads and a ground line at a periphery of a film circuit formed on a first layer of a metal stacking plate, said metal stacking plate having at least three layers, the second layer having a thickness which is greater than a thickness of the first layer, one of said layers being an etching stopper;
selectively forming an insulating layer on said metal stacking plate;
selectively etching the second layer;
etching the first layer and the etching stopper layer using said leads as a mask to make said leads electrically isolated;
adhering a conductive reinforcing plate to said film circuit;
electrically connecting said ground line and said reinforcing plate at a periphery of said film circuit;
locating a semiconductor element in an opening in said reinforcing plate;
bonding electrodes of said semiconductor element to said leads; and
sealing a space between said reinforcing plate, said film circuit and said semiconductor element.

4. A method of manufacturing a semiconductor device according to claim 3, wherein at least a portion of said reinforcing plate protrudes from an edge of the film circuit and the protruding portion is electrically connected with said interconnecting film via a conductive paste.

5. A method for manufacturing a semiconductor device according to claim 3, further comprising a step of forming an external ring by extending at least one layer of said metal stacking plate which is used as said ground line.

6. A method for assembling a semiconductor device assembly, the method comprising the steps of:
a) manufacturing a semiconductor device by
adhering an electrically conductive reinforcing plate to a film circuit;
placing a semiconductor element at a location surrounded by said reinforcing plate;
bonding electrodes of said semiconductor element to a terminal of said film circuit on a semiconductor-element side; and
sealing a space between said reinforcing plate, said film circuit, and said semiconductor element; and
b) joining said semiconductor device to a circuit board by interconnecting respective electrodes.

7. A method for assembling a semiconductor device assembly according to claim 6, wherein the steps of manufacturing a semiconductor device further comprises a step of electrically connecting the reinforcing plate with a ground line formed in a periphery of said film circuit.

8. A method of assembling a semiconductor device assembly, comprising the steps of:
a) manufacturing a semiconductor device by:
forming a plurality of leads and a ground line at a periphery of a film circuit formed on a first layer of a metal stacking plate, said metal stacking plate having at least three layers, the second layer having a thickness which is greater than a thickness of the first layer, one of said layers being an etching stopper;
selectively forming an insulating layer on said metal stacking plate;

selectively etching the second layer;

etching the first layer and the etching stopper layer using said leads as a mask to make said leads electrically isolated;

adhering a conductive reinforcing plate to said film circuit;

electrically connecting said ground line and said reinforcing plate at a periphery of said film circuit;

locating a semiconductor element in an opening in said reinforcing plate;

bonding electrodes of said semiconductor element to said leads; and sealing a space between said reinforcing plate, said film circuit and said semiconductor element; and b) joining said semiconductor device to a circuit board by interconnecting respective electrodes.

9. A method of assembling a semiconductor device assembly according to claim 8, wherein at least a portion of said reinforcing plate protrudes from an edge of the film circuit and the protruding portion is electrically connected with said interconnecting film via a conductive paste.

10. A method for assembling a semiconductor device assembly according to claim 8, wherein the steps of manufacturing the semiconductor device further comprises a step of forming an external ring by extending at least one layer of said metal stacking plate which is used as said ground line.

* * * * *